United States Patent
Gulati et al.

(10) Patent No.: US 8,929,153 B1
(45) Date of Patent: Jan. 6, 2015

(54) MEMORY WITH MULTIPLE WORD LINE DESIGN

(71) Applicant: QUALCOMM Incorporated, San Diego, CA (US)

(72) Inventors: Chirag Gulati, Kota (IN); Rakesh Kumar Sinha, Bangalore (IN); Ritu Chaba, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/975,254

(22) Filed: Aug. 23, 2013

(51) Int. Cl.
G11C 7/00 (2006.01)
G11C 11/419 (2006.01)

(52) U.S. Cl.
CPC .................................. G11C 11/419 (2013.01)
USPC ............ 365/189.02; 365/189.03; 365/189.15; 365/189.19; 365/203

(58) Field of Classification Search
CPC .................................................... G11C 11/419
USPC ............. 365/189.02, 189.03, 189.15, 189.19, 365/203
See application file for complete search history.

(56) References Cited

U.S. PATENT DOCUMENTS

| | | | |
|---|---|---|---|
| 5,089,992 A * | 2/1992 | Shinohara | 365/51 |
| 5,317,537 A * | 5/1994 | Shinagawa et al. | 365/189.04 |
| 5,959,931 A | 9/1999 | Ueda | |
| 6,188,632 B1 * | 2/2001 | Perets et al. | 365/230.04 |
| 6,614,710 B2 * | 9/2003 | Song et al. | 365/230.03 |
| 6,674,670 B2 * | 1/2004 | Jeung | 365/189.15 |
| 6,990,025 B2 * | 1/2006 | Kirihata et al. | 365/189.07 |
| 6,999,341 B2 * | 2/2006 | Ooishi | 365/171 |
| 7,027,326 B2 * | 4/2006 | Luk et al. | 365/175 |
| 7,136,296 B2 * | 11/2006 | Luk et al. | 365/154 |
| 7,286,437 B2 * | 10/2007 | Kim et al. | 365/230.05 |
| 7,400,523 B2 * | 7/2008 | Houston | 365/154 |
| 7,499,312 B2 | 3/2009 | Matick et al. | |
| 7,525,868 B2 | 4/2009 | Liaw | |
| 7,646,648 B2 * | 1/2010 | Arsovski | 365/189.04 |
| 7,719,880 B2 * | 5/2010 | Nakazato | 365/156 |
| 7,969,811 B2 * | 6/2011 | Nii | 365/230.06 |
| 8,320,163 B2 * | 11/2012 | Lee | 365/154 |
| 8,363,484 B2 * | 1/2013 | Chandra et al. | 365/189.04 |
| 2007/0205470 A1 | 9/2007 | Kang et al. | |
| 2013/0077416 A1 | 3/2013 | Hold | |

OTHER PUBLICATIONS

International Search Report And Written Opinion—PCT/US2014/052024—ISA/EPO—Oct. 28, 2014.

* cited by examiner

*Primary Examiner* — Viet Q Nguyen
(74) *Attorney, Agent, or Firm* — Arent Fox LLP

(57) ABSTRACT

Disclosed are various apparatuses and methods for a memory with a multiple read word line design. A memory may include a plurality of bit cells arranged in a row, a first read word line connected to a first subset of the plurality of bit cells, and a second read word line connected to a second subset of the plurality of bit cells, wherein the first and second subsets are located in the same row of bit cells. A method may include asserting, during a first read operation, a first read word line connected to a first subset of a plurality of bit cells arranged in a row of bit cells, and asserting, during a second read operation, a second read word line connected to a second subset of the plurality of bit cells, wherein the first and second subsets are located in the same row of bit cells.

29 Claims, 5 Drawing Sheets

MEMORY WITH MULTIPLE WORD LINE DESIGN

BACKGROUND

1. Field

The present disclosure relates generally to integrated circuits, and more particularly, to memory with a multiple word line design.

2. Background

Memory may include bit cells arranged in rows and columns. Each row may include many bit cells. Each bit cell may include a number of transistors arranged in various configurations. Separate read and write word lines may perform read and write operations, respectively. During a read operation, existing designs may use a single read word line. When a read word line connected to a bit cell is asserted, the read bit line connected to that bit cell may discharge. When the read bit line discharges, the read bit line must subsequently be recharged for the next read operation.

There exist circumstances where it is not necessary to read data stored in every bit cell in a particular row. As such, it may not always be necessary to discharge the read bit line of every bit cell in that particular row of bit cells. When the read bit line connected to bit cells that do not need to be read is needlessly discharged, that read bit line needs to be re-charged for the next read operation. Power is consumed to perform this re-charge.

SUMMARY

One aspect of a memory is disclosed. A memory may include a plurality of bit cells arranged in a row, a first read word line connected to a first subset of the plurality of bit cells, and a second read word line connected to a second subset of the plurality of bit cells, wherein the first and second subsets are located in the same row of bit cells.

One aspect of a method is disclosed. A method may include asserting, during a first read operation, a first read word line connected to a first subset of a plurality of bit cells arranged in a row of bit cells, and asserting, during a second read operation, a second read word line connected to a second subset of the plurality of bit cells, wherein the first and second subsets are located in the same row of bit cells.

One aspect of an apparatus is disclosed. An apparatus may include means for asserting a first read word line during a first read operation, the first read word line connected to a first subset of a plurality of bit cells arranged in a row of bit cells, and means for asserting a second read word line during a second read operation, the second read word line connected to a second subset of the plurality of bit cells, wherein the first and second subsets are located in the same row of bit cells.

Other aspects of apparatuses and methods described herein will become readily apparent to those skilled in the art based on the following detailed description, wherein various aspects of apparatuses and methods are shown and described by way of illustration. These aspects may be used in many different forms and its details may be modified in various ways without deviating from the scope of the present disclosure. Accordingly, the drawings and detailed description provided herein are to be regarded as illustrative in nature and not as restricting the scope of the claims.

BRIEF DESCRIPTION OF THE DRAWINGS

Various aspects of apparatuses and methods will now be presented in the detailed description by way of example, and not by way of limitation, with reference to the accompanying drawings, wherein.

Figure 1:
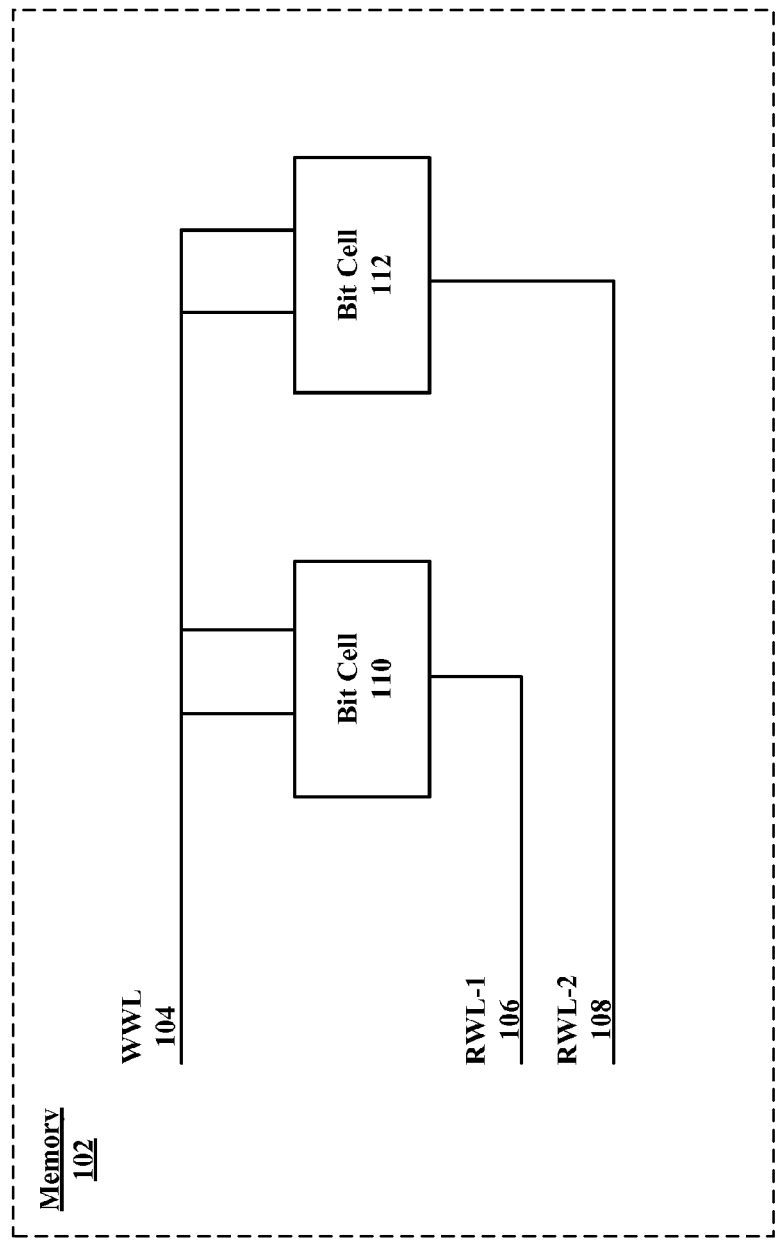
FIG. 1 is an architectural illustration of one example of a memory.

The word "exemplary" is used herein to mean "serving as an example, instance, or illustration." Any aspect described herein as "exemplary" is not necessarily to be construed as preferred or advantageous over other aspects.

DETAILED DESCRIPTION

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be used or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

The various circuits described throughout this disclosure may be used in various forms of hardware. By way of example, any of these circuits, either alone or in combination, may be used as an integrated circuit, or as part of an integrated circuit. The integrated circuit may be an end product, such as a microprocessor, a digital signal processor (DSP), an application specific integrated circuit (ASIC), programmable logic, memory, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

FIG. 1 is an architectural illustration of one example of a memory 102 including two bit cells 110, 112. Each bit cell may include one or more ports. A 2-port bit cell may include a read port and a write port. Although referred to herein as a 'bit cell,' the bit cell may alternatively be a memory cell, a register file, or any other similar circuit that can store, and/or be used to retrieve, a charge or bit.

During a write operation, the write word line (WWL) 104 may be asserted, which can cause data values to be stored in the bit cells 110, 112. In this example, both bit cells 110, 112 are connected to the same WWL 104. However, it will be understood by one of ordinary skill in the art that more than one WWL may be used without deviating from the scope of the present innovation. During a read operation, the read word lines RWL-1 106, RWL-2 108 may be asserted. In this example, the memory 102 includes two bit cells 110, 112. However, it will be understood by one of ordinary skill in the art that more than two bit cells may be used without deviating from the scope of the present innovation. Bit cell 110 is connected to the first read word line RWL-1 106, and bit cell 112 is connected to the second read word line RWL-2 108. When RWL-1 106 is asserted, bit cell 110 is enabled to perform a read operation. When RWL-2 108 is asserted, bit cell 112 is enabled to perform a read operation. Although some exemplary embodiments presented herein describe a memory design with two read word lines (RWLs), it will be understood by one of ordinary skill in the art that more than two RWLs (i.e., any multiple number of RWLs) may be used without deviating from the scope of the present innovation. Details about the process of outputting the stored bit value from the bit cells 110, 112 are provided further below.

Figure 2:
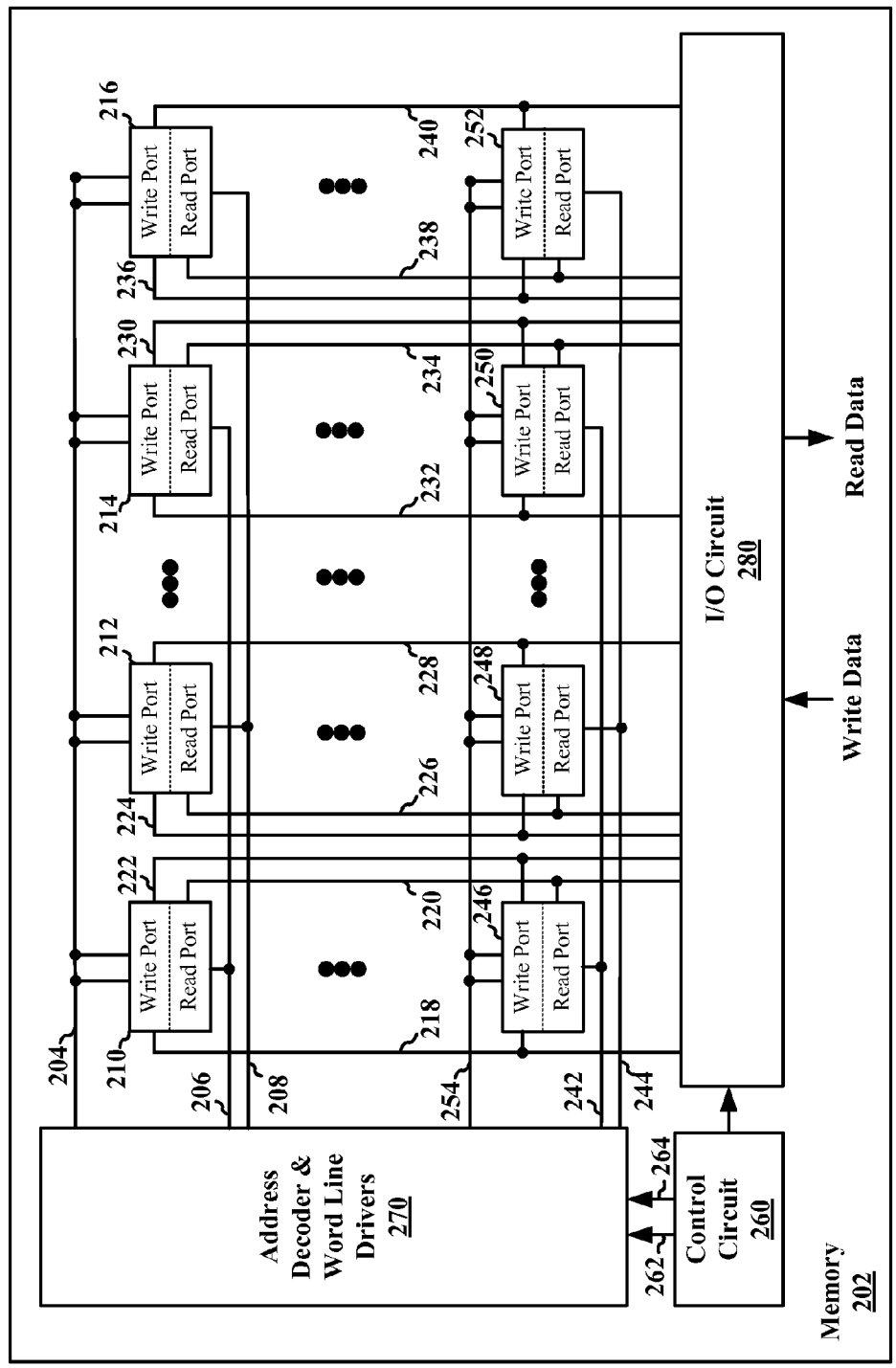
FIG. 2 is a block diagram of one example of the memory.

FIG. 2 is a block diagram of one example of the memory 202. A processor (not shown) may provide the address and control signals over a bus (not shown) to read and write from the memory 202. The address and control signals may be received by the control circuit 260 of the memory 202. However, as is known by one of ordinary skill in the art, the address and control signals may be provided by other devices either external or internal to the memory 202. In response to receiving the address and control signals, the control circuit 260 may send a write enable signal 262 and/or a read enable signal 264 to the address decoder and word line drivers 270. The address decoder and word line drivers 270 may decode the address in order to enable the appropriate bit cell. The address decoder & word line drivers 270 may provide a means for asserting a first read word line (e.g., 206) during a first read operation, the first read word line (e.g., 206) connected to a first subset (e.g., 210, 214) of a plurality of bit cells arranged in a row of bit cells. The address decoder & word line drivers 270 may provide a means for asserting a second read word line (e.g., 208) during a second read operation, the second read word line (e.g., 208) connected to a second subset (e.g., 212, 216) of the plurality of bit cells.

When a write enable signal 262 is received by the address decoder and word line drivers 270, the address decoder and word line drivers 270 may assert the write word line 204, 254 corresponding to the row that corresponds to the address received by the control circuit 260. For example, if the address corresponds to bit cell 210, the address decoder and word line drivers 270 will assert write word line 204. When a read enable signal 264 is received by the address decoder and word line drivers 270, the address decoder and word line drivers 270 may assert the read word line 206, 208, 242, 244 that corresponds to the address received by the control circuit 260. For example, if the address corresponds to bit cell 210 or bit cell 214, the address decoder and word line drivers 270 will assert read word line 206; however, the address decoder and word line drivers 270 will not assert read word line 208. On the other hand, if the address corresponds to bit cell 212 or bit cell 216, the address decoder and word line drivers 270 will not assert read word line 206; instead, the address decoder and word line drivers 270 will assert read word line 208.

The memory 202 may include many rows and many columns of bit cells 210, 212, 214, 216, 246, 248, 250, 252. In the example illustrated in FIG. 2, each bit cell 210, 212, 214, 216, 246, 248, 250, 252 is a 2-port bit cell that includes a read port and a write port. The memory 202 may be a register file. A register file may include fewer (or more) rows and/or columns of bit cells as the memory 202 illustrated in FIG. 2. As is discussed in greater detail below with reference to FIG. 3, the read port is used during read operations of the memory 202, and the write port is used during write operations of the memory 202. Accordingly, the write word line 204, 254 is connected to the write port, and the read word line 206, 208, 242, 244 is connected to the read port. However, one of ordinary skill in the art will appreciate that alternative embodiments of memory including a single port, or more than two ports, may be used without deviating from the scope of the present innovation.

In the example shown in FIG. 2, bit cells 210, 214 are connected to read word line 206, and bit cells 212, 216 are connected to read word line 208. Asserting read word line 206 will enable bit cells 210, 214 (but not bit cells 212, 216), and the value (e.g., logic value 0 or 1) in the read bit lines 220, 234 may be read by the I/O circuit 280. Asserting read word line 208 will enable bit cells 212, 216 (but not bit cells 210, 214), and the value (e.g., logic value 0 or 1) in the read bit lines 226, 238 may be read by the I/O circuit 280. Asserting write word line 204 will enable bit cells 210, 212, 214, 216 (i.e., all of the bit cells in that particular row).

The relationship between bit cells 246, 248, 250, 252 and read word lines 242, 244 and write word line 254 is similar to the one discussed above with respect to bit cells 210, 212, 214, 216 and read word lines 206, 208 and write word line 204.

The foregoing is merely one exemplary configuration of read word lines, write word lines, and bit cells. It will be understood by one of ordinary skill in the art that alternative configurations of read word lines, write word lines, and bit cells may be within the scope of the present innovation. In one configuration, although not shown in FIG. 2, bit cell 210 may be the only bit cell connected to read word line 206, while all other bit cells 212, 214, 216 in that row may be connected to read word line 208. In another configuration, although not shown in FIG. 2, bit cells 210, 212, 214, 216 may be connected to read word lines 206, 208 in a different configuration as the configuration that bit cells 246, 248, 250, 252 are connected to read word lines 242, 244. For example, bit cells 210, 212 may be connected to read word line 206 and bit cells 214, 216 may be connected to read word line 208, while bit cells 246, 248 may be connected to read word line 244 and bit cells 250, 252 are connected to read word line 242. In yet another configuration, although not shown in FIG. 2, more than two read word lines may be used in a single row of bit cells. For example, bit cells 210, 212, 214, 216 may be connected to three (or more) read word lines in various configurations.

The I/O circuit 280 may be used in write and read operations of the memory 202. The I/O circuit 280 may include a pre-charge circuit connected to the write bit lines 218, 222, 224, 228, 232, 230, 236, 240. The I/O circuit 280 may also include one or more sense amplifiers that are connected to the read bit lines 220, 226, 234, 238. The one or more sense amplifiers may provide a means for sensing, during the first read operation, values in read bit lines (e.g., 220, 234) of the first subset (e.g., 210, 214) when the first read word line (e.g., 206) is asserted. The one or more sense amplifiers may also provide a means for sensing, during the second read operation, values in read bit lines (e.g., 226, 238) of the second subset (e.g., 212, 216) when the second read word line (e.g., 208) is asserted.

The I/O circuit 280 may also include one or more multiplexers. The one or more multiplexers may provide a means for multiplexing the sensed value of a read bit line (e.g., 220, 234) of the first subset (e.g., 210, 214) and the sensed value of a read bit line (e.g., 226, 238) of the second subset (e.g., 212, 216). In some embodiments, the memory 202 (e.g., a register file) may store multiple 'words' (e.g., a series of data values) in each row of bit cells. For example, bit cells 246, 248, 250, 252 may store two words. In a MUX-2 multiplexing configuration, read bit lines 220, 226 may be multiplexed together and read bit lines 234, 238 may be multiplexed together. A first word may be read during a first read operation and a second word may be read during a second read operation. The same sense amplifier may be used to read a first bit line (associated with the first "word") as the sense amplifier used to read a second bit line (associated with the second "word"). For example, the same sense amplifier may be used to read the value (e.g., logic value 0 or 1) in read bit line 220 as the sense amplifier used to read the value (e.g., logic value 0 or 1) in read bit line 226. Without multiplexing, in this example, two separate sense amplifier would be needed for each of the two read bit lines 220, 226. However, using multiplexing, a single sense amplifier may be used to read two different read bit lines. Accordingly, using multiplexing, fewer sense amplifiers may be needed.

Although a MUX-2 multiplexing configuration has been described herein, one of ordinary skill in the art will appreciate that alternative multiplexing configurations may be used without deviating from the scope of the present disclosure.

Figure 3:
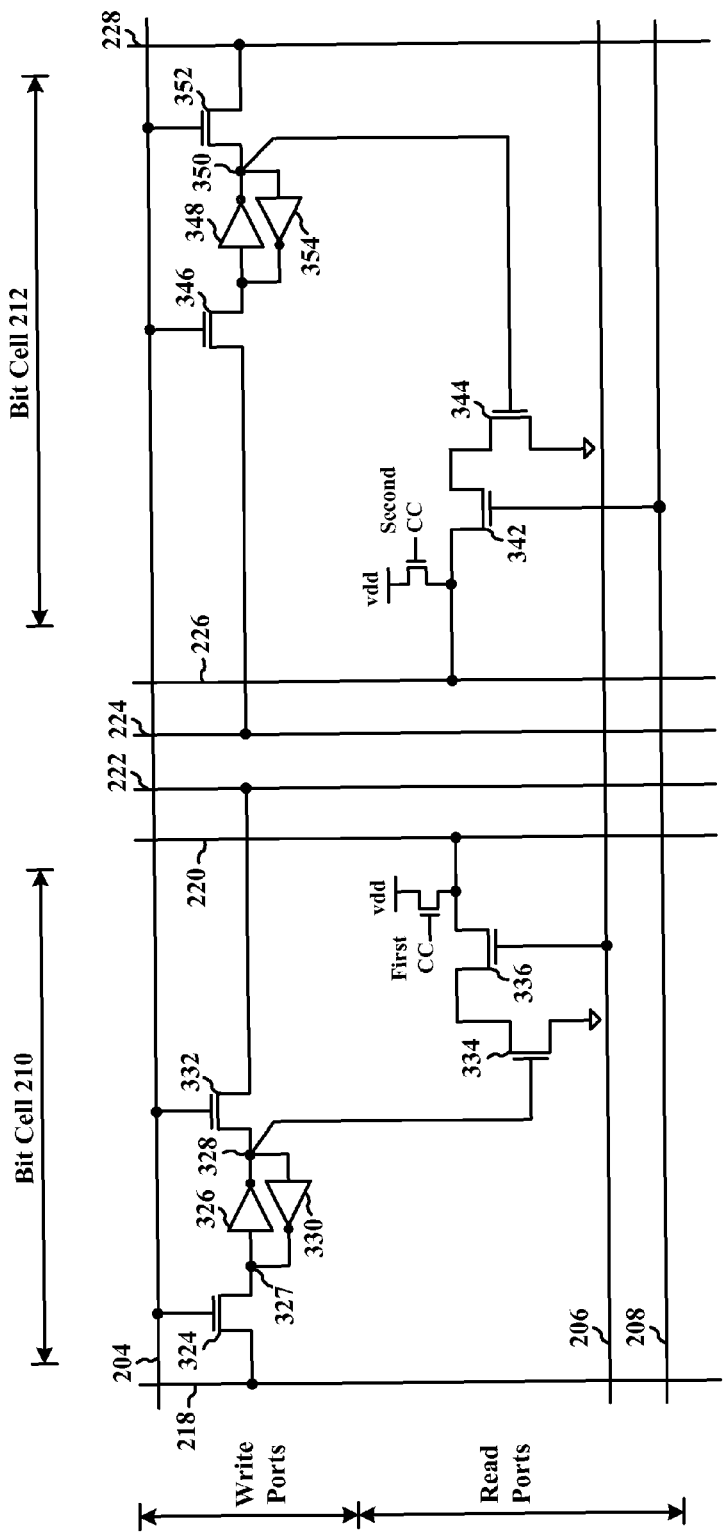
FIG. 3 is a schematic representation of exemplary bit cells of the memory.

FIG. 3 is a schematic representation of bit cells 210, 212 of the memory. Bit cell 210 includes a write port and a read port. In bit cell 210, the read port includes n-type transistors 334, 336, and read bit line 220. In bit cell 210, the write port includes two pass-gate n-type transistors 324, 332, write word line 204, and write bit lines 218, 222.

Prior to a write operation, write bit lines 218, 222 may be pre-charged to a voltage that is halfway between vdd and ground. To write a logic value of one (1) to the bit cell 210 during the write operation, the write bit line 218 is raised to vdd (e.g., logic value 1). Write bit lines 218, 222 are complements of each other. For example, when write bit line 218 is high (e.g., logic value 1), write bit line 222 is low (e.g., logic value 0). Accordingly, when write bit line 218 is raised to vdd (e.g., logic value 1), write bit line 222 is lowered to ground (e.g., logic value 0). When the write word line 204 is asserted, pass-gate n-type transistors 324, 332 are turned on and the values in the write bit lines 218, 222 are stored at nodes 327, 328, respectively. The value at node 327 corresponds to the data value stored in the bit cell 210. For example, the bit cell 210 stores a logic value of one (1) when node 327 is high (e.g., logic value 1) and node 328 is low (e.g., logic value 0). Conversely, the bit cell 210 stores a value of zero (0) when node 327 is low (e.g., logic value 0) and node 328 is high (e.g., logic value 1). After the data value is written to the bit cell 210, the write word line 204 may be de-asserted.

With respect to the write operation of bit cell 212, pass-gate n-type transistors 346, 352, inverters 348, 354, and write bit lines 224, 228 inter-relate in a similar way as pass-gate n-type transistors 324, 332, inverters 326, 330, and write bit lines 218, 222 of bit cell 210.

In the example illustrated in FIG. 3, the value (e.g., logic value 0 or 1) at node 328 in the write port will affect the read port. In the read port, turning on the first charging circuit (CC) will pre-charge the read bit line 220 to vdd (e.g., logic value 1). The first CC provides a means for pre-charging, during the first read operation, read bit lines (e.g., 220) of the first subset (e.g., 210) prior to asserting the first read word line (e.g., 206). When read word line 206 is asserted, n-type transistor 336 will be turned on. If the value at node 328 (in the write port) is high (e.g., logic value 1), then n-type transistor 334 will be turned on, thereby pulling the read bit line 220 low (e.g., logic value 0). On the other hand, if the value at node 328 is low (e.g., logic value 0), then n-type transistor 334 will not be turned on, thereby allowing the read bit line 220 to remain high (e.g., logic value 1). The value (e.g., logic value 0 or 1) in the read bit line 220 is detected by the I/O circuit 280 (see FIG. 2).

With the exception of n-type transistor 342 having its gate connected to read word line 208 (instead of read word line 206), bit cell 212 is substantially similar to bit cell 210. In bit cell 212, read bit line 226 is pre-charged to vdd (e.g., logic value 1) when the second CC is enabled. The second CC provides a means for pre-charging, during the second read operation, bit lines (e.g., 226) of the second subset (e.g., 212) prior to asserting the second read word line (e.g., 208). When the value stored at node 350 is high (e.g., logic value 1) (thereby turning on n-type transistor 344) and the read word line 208 is asserted (thereby turning on n-type transistor 342), read bit line 226 will be pulled low (e.g., logic value 0). If the value at node 350 is low (e.g., logic value 0), read bit line 226 will remain high (e.g., logic value 1). The value (e.g., logic value 0 or 1) of the read bit line 226 is detected by the I/O circuit 280 (see FIG. 2).

After read bit line 220 is pulled low (e.g., logic value 0), the read bit line 220 will need to be re-charged (e.g., pulled high to logic value 1) for the next read operation. The first charging circuit (CC) may be used to perform the re-charging of the read bit line 220. The first CC provides a means for re-charging, during the first read operation, the read bit lines (e.g., 220) of the first subset (e.g., 210) after asserting the first read word line (e.g., 206). After read bit line 226 discharges, the read bit line 226 will need to be re-charged for the next read operation. The second CC may be used to perform the re-charging. The second CC provides a means for re-charging, during the second read operation, the read bit lines (e.g., 226) of the second subset (e.g., 212) after asserting the second read word line (e.g., 208).

The first CC may be enabled during a first read operation. The second CC may be enabled during a second read operation. The first CC may be enabled at a time after the read word line 220 has been discharged (e.g., logic value 0). The second CC may be enabled at a time after the read word line 226 has been discharged (e.g., logic value 0). Accordingly, the first and second CCs may not be enabled at the same time.

Re-charging the read bit lines of the bit cells requires power. Existing designs may use a single read word line (as opposed to multiple read word lines). In a single read word line design, a single read word line may cause the read bit line of bit cells storing a data value of zero (0) to discharge. Discharging those read bit lines will necessitate a subsequent re-charging of those read bit lines for the next read operation. Assume, for example, that only some (but not all) of the bit cells in that particular row need to be read. In this example, discharging the read bit line of those bit cells would result in needless power consumption because the read bit line of some of those bit cells (for which data was not supposed to be read) would needlessly discharge and subsequently require re-charge.

A significant portion of the power consumed during a read operation of memory is due to charging of the read bit lines (after those read bit lines have been discharged during a previous read operation). As previously discussed, in a single read word line design, asserting the read word line will enable the entire row of bit cells. If 50% of the bit cells store a data value of zero (0), then 50% of the read bit lines will discharge during a single read operation. However, in a dual read word line design, only half of the row of bit cells is enabled during a single read operation. If 50% of those enabled bit cells store a data value of zero (0), then 25% of the read bit lines will discharge during a single read operation. As previously mentioned, in a single read word line design, 50% of the read bit lines will discharge during a single read operation. Therefore, in this example, approximately 25% of the power consumed during a single read operation will be conserved by using a dual read word line design instead of a single read word line design.

The example bit cell illustrated in FIG. 3 is one type of an eight-transistor bit cell. However, it will be understood by one of ordinary skill in the art that alternative bit cells may be used without deviating from the scope of the present innovation. For example, although not illustrated in FIG. 3, a six-transistor bit cell, or other type of eight-transistor bit cell, may be used.

Figure 4:
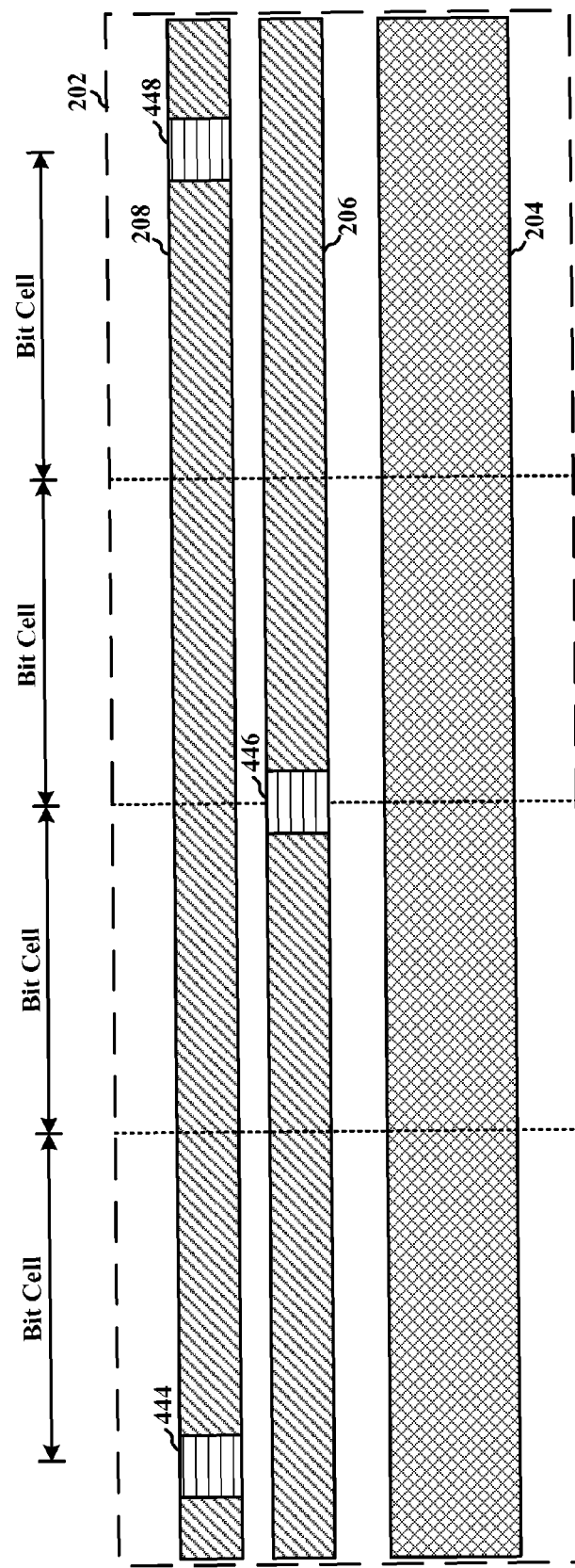
FIG. 4 is a top-view illustration of exemplary word lines of the memory.

FIG. 4 is a top-view illustration of various metal layers of the memory 202. For example, the write word line 204 may be located in a metal layer called metal-2, and the read word lines 206, 208 may be located in a different metal layer called metal-3. However, one of ordinary skill in the art will appreciate that the memory 202 includes many other metal layers that are not illustrated in FIG. 4 and various other configurations of read and write word lines may be used without deviating from the scope of the present disclosure.

Vias 444, 446, 448 may provide passageways that allow connectivity between different metal layers such that read word lines located in one metal layer may have connectivity with the read ports of bit cells in different metal layers. For example, via 446 may provide the passageway for the connection between read word line 206 (which may be located in the metal-3 layer) and the gate of n-type transistor 336 in the read port of bit cell 210 (which may be located in a different layer) (see FIG. 3).

In existing designs, the surface area of a single read word line (not shown) may be the same as the surface area of the (single) write word line 204 shown in FIG. 4. However, as shown in FIG. 4, the combined surface area of the two read word lines 206, 208 does not exceed the surface area of the (single) write word line 204. Accordingly, the combined surface area of the two read word lines 206, 208 would not exceed the surface area of a single read word line (not shown). Thus, compared to a single read word line design, the dual read word line design does not increase the footprint of the read word lines, while maintaining the performance of read operations and decreasing power consumption (as previously discussed).

Figure 5:
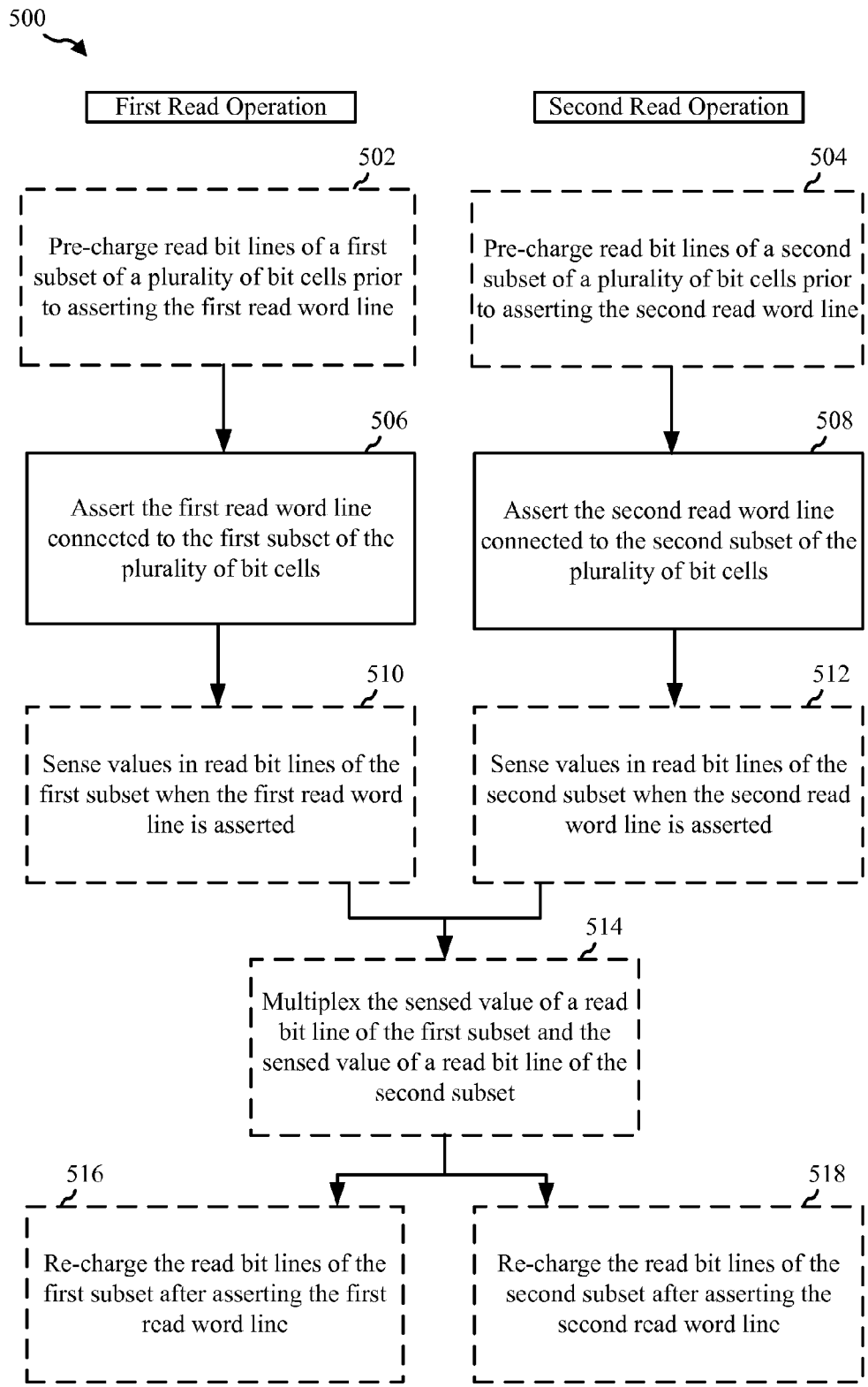
FIG. 5 is a flowchart illustrating an exemplary operation performed by the memory.

FIG. 5 is a flowchart illustrating an exemplary operation performed by the memory. The operation may include a method 500. At block 502, during a first read operation, the memory may pre-charge read bit lines of a first subset of a plurality of bit cells prior to asserting the first read word line. For example, referring to FIG. 3, the first CC may be enabled to pre-charge the read bit line 220 to vdd (e.g., logic value 1).

At block 504, during a second read operation, the memory may pre-charge read bit lines of a second subset of a plurality of bit cells prior to asserting the second read word line. For example, referring to FIG. 3, the second CC may be enabled to pre-charge the read bit line 226 to vdd (e.g., logic value 1).

At block 506, during the first read operation, the memory may assert the first read word line connected to the first subset of the plurality of bit cells. For example, referring to FIG. 2, the address decoder and word line drivers 270 may assert read word line 206, which is connected to the read port of bit cells 210, 214. At block 508, during the second read operation, the memory may assert the second read word line connected to the second subset of the plurality of bit cells. For example, referring to FIG. 2, the address decoder and word line drivers 270 may assert read word line 208, which is connected to the read port of bit cells 212, 216.

At block 510, during the first read operation, the memory may sense values in read bit lines of the first subset when the first read word line is asserted. For example, referring to FIG. 2, the one or more sense amplifiers (not shown) in the I/O circuit 280 may sense values in read bit lines 220, 234 of the first subset 210, 214 when the first read word line 206 is asserted. At block 512, during the second read operation, the memory may sense values in read bit lines of the second subset when the second read word line is asserted. For example, referring to FIG. 2, the one or more sense amplifiers (not shown) in the I/O circuit 280 may sense values in read bit lines 226, 238 of the second subset 212, 216 when the second read word line 208 is asserted.

At block 514, the memory may multiplex the sensed value of a read bit line of the first subset and the sensed value of a read bit line of the second subset. For example, referring to FIG. 2, the multiplexer (not shown) in the I/O circuit 280 may multiplex the sensed value (e.g., logic value 0 or 1) of a read bit line (e.g., 220) of the first subset (e.g., 210) and the sensed value (e.g., logic value 0 or 1) of a read bit line (e.g., 226) of the second subset (e.g., 212).

At block 516, during the first read operation, the memory may re-charge the read bit lines of the first subset after asserting the first read word line. For example, referring to FIG. 3, the first CC of bit cell 210 may be enabled to re-charge the read bit line 220 to vdd (e.g., logic value 1) after asserting the first read word line 206. At block 518, during the second read operation, the memory may re-charge the read bit lines of the second subset after asserting the second read word line. For example, referring to FIG. 3, the second CC of bit cell 212 may be enabled to re-charge read bit line 226 to vdd (e.g., logic value 1) after asserting the second read word line 208.

The foregoing method 500 is merely one exemplary illustration of an operation that may be performed by the memory. Additional methods may be performed by the memory without deviating from the scope of the present innovation. Further, the specific order or hierarchy of blocks in the processes disclosed in FIG. 5 is merely an illustration of one example. Based upon design preferences, the specific order or hierarchy of blocks in the process may be re-arranged, amended, and/or modified. The accompanying method claims include various limitations related to a process, but the recited limitations are not meant to be limited in any way by the specific order or hierarchy depicted in FIG. 5, unless expressly so stated in the claims.

Although various aspects of the present disclosure have been described as software implementations, those skilled in the art will readily appreciate that the various software modules presented throughout this disclosure may be used in hardware, or any combination of software and hardware. Whether these aspects are used in hardware or software depends upon the particular application and design constraints imposed on the overall system. Those with ordinary skill in the art may use the described functionality in varying ways for each particular application, but such implementation decisions should not be interpreted as causing a departure from the scope of the disclosure. The foregoing description is provided to enable any person skilled in the art to fully understand the scope of the disclosure. Modifications to various aspects disclosed herein will be readily apparent to those skilled in the art. Accordingly, the scope of the claims will not be limited to the various exemplary embodiments provided herein. Reference to an element in the singular is not intended to mean "one and only one" unless specifically stated as such; instead, reference to an element in the singular shall mean "one or more." Unless specifically stated otherwise, the term "some" refers to one or more. No claim element is to be construed under the provisions of 35 U.S.C. §112(f) unless the element is expressly recited using the phrase "means for" or, in the case of a method claim, the element is recited using the phrase "step for." The claims are not intended to be limited to the various aspects of this disclosure, but are to be accorded the full scope consistent with the language of the claims. All structural and functional equivalents to the various components of the exemplary embodiments described throughout this disclosure that are known to those of ordinary skill in the art are expressly incorporated herein by reference and are intended to be encompassed by the claims.

What is claimed is:

1. A memory comprising:
a plurality of bit cells arranged in a row;
a first read word line connected to a first subset of the plurality of bit cells;
a second read word line connected to a second subset of the plurality of bit cells, wherein the first and second subsets are located in the same row of bit cells;
a first charging circuit configured to pre-charge read bit lines of the first subset prior to asserting the first read word line; and
a second charging circuit configured to pre-charge read bit lines of the second subset prior to asserting the second read word line.

2. The memory of claim 1, wherein:
the first charging circuit is further configured to re-charge the read bit lines of the first subset after asserting the first read word line; and
the second charging circuit is further configured to re-charge the read bit lines of the second subset after asserting the second read word line.

3. A memory comprising:
a plurality of bit cells arranged in a row;
a first read word line connected to a first subset of the plurality of bit cells;
a second read word line connected to a second subset of the plurality of bit cells, wherein the first and second subsets are located in the same row of bit cells;
further comprising one or more sense amplifiers configured to:
sense values in read bit lines of the first subset when the first read word line is asserted; and
sense values in read bit lines of the second subset when the second read word line is asserted;
further comprising a multiplexer configured to multiplex the sensed value of a read bit line of the first subset and the sensed value of a read bit line of the second subset.

4. The memory of claim 1, further comprising a write word line connected to the plurality of bit cells, wherein a combined surface area of the first and second read word lines does not exceed a surface area of the write word line.

5. The memory of claim 1, further comprising a write word line connected to the plurality of bit cells, wherein the write word line, the first read word line, and the second read word line are located in at least two metal layers.

6. The memory of claim 5, wherein:
the first and second read word lines are located in a first metal layer of the at least two metal layers; and
the write word line is located in a second metal layer of the at least two metal layers.

7. The memory of claim 1, wherein each of the plurality of bit cells has a write port and a read port.

8. The memory of claim 1, wherein each of the plurality of bit cells has an eight-transistor configuration.

9. The memory of claim 1, wherein each of the plurality of bit cells is a static random access memory (RAM) bit cell.

10. A method comprising:
during a first read operation, asserting a first read word line connected to a first subset of a plurality of bit cells arranged in a row of bit cells;
during a second read operation, asserting a second read word line connected to a second subset of the plurality of bit cells, wherein the first and second subsets are located in the same row of bit cells;
during the first read operation, pre-charging read bit lines of the first subset prior to asserting the first read word line; and
during the second read operation, pre-charging read bit lines of the second subset prior to asserting the second read word line.

11. The method of claim 10, further comprising:
during the first read operation, re-charging the read bit lines of the first subset after asserting the first read word line; and
during the second read operation, re-charging the read bit lines of the second subset after asserting the second read word line.

12. The method of claim 10, further comprising:
during the first read operation, sensing values in read bit lines of the first subset when the first read word line is asserted; and
during the second read operation, sensing values in read bit lines of the second subset when the second read word line is asserted.

13. The method of claim 12, further comprising:
multiplexing the sensed value of a read bit line of the first subset and the sensed value of a read bit line of the second subset.

14. The method of claim 10, wherein a combined surface area of the first and second read word lines does not exceed a surface area of a write word line connected to the plurality of bit cells.

15. The method of claim 10, wherein a write word line connected to the plurality of bit cells, the first read word line, and the second read word line are located in at least two metal layers.

16. The method of claim 15, wherein:
the first and second read word lines are located in a first metal layer of the at least two metal layers; and
the write word line is located in a second metal layer of the at least two metal layers.

17. The method of claim 10, wherein each of the plurality of bit cells has a write port and a read port.

18. The method of claim 10, wherein each of the plurality of bit cells has an eight-transistor configuration.

19. The method of claim 10, wherein each of the plurality bit cells is a static random access memory (RAM) bit cell.

20. An apparatus comprising:
means for asserting a first read word line during a first read operation, the first read word line connected to a first subset of a plurality of bit cells arranged in a row of bit cells; and
means for asserting a second read word line during a second read operation, the second read word line connected to a second subset of the plurality of bit cells, wherein the first and second subsets are located in the same row of bit cells;
means for pre-charging, during the first read operation, read bit lines of the first subset prior to asserting the first read word line; and
means for pre-charging, during the second read operation, read bit lines of the second subset prior to asserting the second read word line.

21. The apparatus of claim 20, further comprising:
means for re-charging, during the first read operation, the read bit lines of the first subset after asserting the first read word line; and
means for re-charging, during the second read operation, the read bit lines of the second subset after asserting the second read word line.

22. The apparatus of claim 20, further comprising:
means for sensing, during the first read operation, values in read bit lines of the first subset when the first read word line is asserted;
means for sensing, during the second read operation, values in read bit lines of the second subset when the second read word line is asserted.

23. The apparatus of claim 22, further comprising:
means for multiplexing the sensed value of a read bit line of the first subset and the sensed value of a read bit line of the second subset.

24. The apparatus of claim 20, wherein a combined surface area of the first and second read word lines does not exceed a surface area of a write word line connected to the plurality of bit cells.

25. The apparatus of claim 20, wherein a write word line connected to the plurality of bit cells, the first read word line, and the second read word line are located in at least two metal layers.

26. The apparatus of claim 25, wherein:
the first and second read word lines are located in a first metal layer of the at least two metal layers; and
the write word line is located in a second metal layer of the at least two metal layers.

27. The apparatus of claim 20, wherein each of the plurality of bit cells has a write port and a read port.

28. The apparatus of claim 20, wherein each of the plurality of bit cells has an eight-transistor configuration.

29. The apparatus of claim 20, wherein each of the plurality of bit cells is a static random access memory (RAM) bit cell.

* * * * *